(12) United States Patent
Larson et al.

(10) Patent No.: US 8,308,991 B2
(45) Date of Patent: Nov. 13, 2012

(54) LOW TEMPERATURE BONDING ELECTRONIC ADHESIVES

(75) Inventors: Eric G. Larson, Lake Elmo, MN (US); Robert L. D. Zenner, Minneapolis, MN (US); Cameron T. Murray, Lake Elmo, MN (US); Ravi K. Sura, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 645 days.

(21) Appl. No.: 12/206,942

(22) Filed: Sep. 9, 2008

(65) Prior Publication Data

US 2009/0087591 A1  Apr. 2, 2009

Related U.S. Application Data

(60) Provisional application No. 60/972,119, filed on Sep. 13, 2007.

(51) Int. Cl.
*H01B 1/06* (2006.01)

(52) U.S. Cl. ..... 252/511; 428/1.1; 428/1.5; 361/679.01; 526/259

(58) Field of Classification Search ............... 526/259; 428/1.1, 1.5; 252/511; 524/844; 548/455; 361/679.01
See application file for complete search history.

(56) References Cited

U.S. PATENT DOCUMENTS

| | | | |
|---|---|---|---|
| 4,323,662 A | 4/1982 | Oba et al. | |
| 4,920,005 A | 4/1990 | Mercer | |
| 5,162,087 A * | 11/1992 | Fukuzawa et al. | 252/500 |
| 5,928,767 A | 7/1999 | Gebhardt et al. | |
| 5,937,166 A | 8/1999 | Fukasawa | |
| 6,034,194 A | 3/2000 | Dershem et al. | |
| 6,034,195 A | 3/2000 | Dershem et al. | |
| 6,039,896 A * | 3/2000 | Miyamoto et al. | 252/511 |
| 6,288,209 B1 | 9/2001 | Jensen | |
| 6,833,180 B1 * | 12/2004 | Kodemura | 428/220 |
| 6,960,636 B2 | 11/2005 | Dershem et al. | |
| 2002/0002244 A1 * | 1/2002 | Hoelter et al. | 525/107 |
| 2002/0007042 A1 | 1/2002 | Herr et al. | |
| 2003/0199638 A1 | 10/2003 | Liu et al. | |
| 2004/0077798 A1 | 4/2004 | Dershem et al. | |
| 2004/0225026 A1 | 11/2004 | Mizori et al. | |
| 2004/0225059 A1 * | 11/2004 | Mizori et al. | 524/811 |

FOREIGN PATENT DOCUMENTS

| | | |
|---|---|---|
| EP | 0 552 984 A2 | 7/1993 |
| EP | 0 969 065 A2 | 1/2000 |
| JP | 4-115407 | 4/1992 |
| JP | 6-275682 | 9/1994 |
| JP | 10-140116 | 5/1998 |
| JP | 10-168413 | 6/1998 |
| JP | 11-035903 | 2/1999 |
| JP | 2002-167555 | 6/2002 |
| JP | 2002-201440 | 7/2002 |
| JP | 2002-285103 | 10/2002 |
| WO | WO 2006/110634 | 10/2006 |
| WO | WO 2008/011452 A1 | 1/2008 |

OTHER PUBLICATIONS

Machine translation of JP 11-035903, Jan. 4, 2012.*
Search Report for SG Application No. 201001478-5.

* cited by examiner

*Primary Examiner* — Angela Ortiz
*Assistant Examiner* — Ruiyun Zhang

(57) ABSTRACT

Provided are adhesive compositions comprising a mixture of a maleimide terminated polyimide resin, a thermoplastic resin compatible with the maleimide terminated polyimide resin, a liquid rubber, and a thermally activated free radical curing agent. Various embodiments add one or more of a silane coupling agent, an ethylenically unsaturated compound with acid functionality, electrically conductive particles, and electrically conductive scrim. Methods of using the compositions also are provided.

16 Claims, No Drawings

LOW TEMPERATURE BONDING ELECTRONIC ADHESIVES

RELATED APPLICATIONS

This application claims priority to U.S. Provisional Application No. 60/972,119, filed Sep. 13, 2007, and which is herein incorporated by reference in its entirety.

TECHNICAL FIELD

This disclosure relates to low temperature bonding electronic adhesives, including electrically conductive adhesive such as anisotropic conductive adhesives.

BACKGROUND

Electronic adhesives can be useful in assembling electronic parts, and often enable assembly as well as establish electrical connections between the assembled parts. An adhesive that has the ability to establish multiple, discrete electrical connections between two electrical components is commonly referred to as an anisotropically conductive adhesive. Such adhesives often are used to provide electrical connection between a flexible circuit and an electrical substrate. An anisotropically conductive adhesive composition also should provide a short bond time, adhere to a variety of substrates, provide a bondline without voids, have satisfactory shelf and storage life, and maintain the physical connection between a flexible circuit and an electrical substrate. The anisotropically conductive adhesive composition should also be easy to manufacture and use.

Some anisotropically conductive adhesive compositions have used microencapsulated imidazoles as thermally activated curing agents. These anisotropically conductive adhesive compositions typically have a shelf life of approximately one week at room temperature. Such adhesive compositions are typically complicated to manufacture because solvent needs to be removed without initiating the cure by the imidazole curatives. If the solvent is not removed completely from such adhesive compositions, voids can result in the subsequent bonding operations. Voids in the bondline can reduce the reliability of the electrical connection during use and can also reduce the adhesion strength of the bonded electrical components. If solvent removal is protracted, the shelf life may be reduced due to partial release of the imidazole. If the viscosity in the adhesive composition prior to cure is too low, then voids may occur in the bondline. Increasing the viscosity of the uncured anisotropically conductive adhesive composition and/or using a curative that is operational at a lower temperature are known methods to reduce voids. However, higher viscosity formulations require more solvent and therefore longer manufacturing processes. Also, if the viscosity is too high, the coating solution may not wet the substrate, resulting in poor adhesion to the substrate. Lower temperature curatives can compromise both shelf stability and the manufacturing process.

Other types of anisotropic conductive adhesives with free-radical cure resins have been suggested in order to provide lower temperature and faster cures. One of the major weaknesses of these systems has been a lack of strong adhesion to a wide variety of flexible circuits.

SUMMARY

The disclosed electronic adhesives overcome one or more of the known deficiencies, and yet allow short bond times at lower temperatures with universally good adhesion and the desired reliability. In some embodiments, the disclosed electronic adhesives provide improved tack concurrently with desirable peel adhesion and bond reliability, often while allowing bonding at lower temperatures.

Provided in one embodiment is an adhesive composition comprising a mixture of a maleimide terminated polyimide resin, a thermoplastic resin compatible with the maleimide terminated polyimide resin, a thermally activated free radical curing agent, and a liquid rubber. Other embodiments add one or more of a silane coupling agent, an ethylenically unsaturated compound with acid functionality, electrically conductive particles, and electrically conductive scrim.

In another embodiment, this disclosure provides a curable adhesive film, tape, or sheet comprising the adhesive composition described above. In another embodiment, this disclosure provides an electronic article comprising a flexible printed circuit and an adhesive composition as described herein adhered to the flexible printed circuit.

In another embodiment, this disclosure provides an electrical connection comprising a flexible printed circuit, an adhesive composition according to the invention, and an electrical substrate with the flexible printed circuit adhered to the electrical substrate with the adhesive composition according to the invention.

In yet another embodiment, this disclosure provides method for attaching a first article to a second article comprising providing an adhesive composition as described herein on the first article, contacting the second article to the adhesive on the first article to form an assembly wherein the first article and the second article have the adhesive therebetween, and curing the adhesive. Electrically conductive pathways may be provided through the adhesive.

The details of one or more embodiments of the present invention are set forth in the description below. Other features, objects, and advantages of the invention will be apparent from the description including the examples and the claims.

DETAILED DESCRIPTION

"Thermoplastic resin" means a resin that softens when exposed to heating above room temperature (about 25° C.) and returns to its original condition when cooled to room temperature.

"Parts by weight" (pbw) means parts of a resin component per weight of the total amount of maleimide terminated polyimide resin, thermoplastic resin compatible with the maleimide terminated polyimide resin, an ethylenically unsaturated compound with acid functionality (if present), coupling agent and thermally activated free-radical curing agent.

All numbers are herein modified by the term "about." The recitation of numerical ranges by endpoints includes all numbers subsumed within that range (e.g., 1 to 5 includes 1, 1.5, 2, 2.75, 3, 3.80, 4, and 5).

The adhesive compositions advantageously can be used to provide a bond between flexible circuits and electrical components without voids in the bondline, which leads to stable and reliable electrical and adhesion properties. The adhesive compositions allow the bonds to be formed at low temperatures and with short bonding times. The formulations of one or more embodiments of the present invention overcome the limitations of short shelf life and voids in the bondline. In addition, the adhesive compositions of various embodiments exhibit desirable tack properties, even at room temperature in some embodiments, making alignment and pretacking easier and more effective.

The maleimide-terminated polyimide resins used in the compositions may be polyimides prepared from primary aliphatic diamines and dicarboxylic dianydrides. Dicarboxylic dianhydrides that are useful in the maleimide-terminated polyimide resins of the present invention are dianhydrides such as pyromelitic dianhydride, tetracarboxylic dianhydride benzophenone, and tetracarboxylic dianhydride butane. The polyimides of the present invention are prepared with excess primary aliphatic amines to allow the end groups to be maleimide terminated. Primary aliphatic diamines that are useful in the maleimide-terminated polyimide resins of the present invention are diamines with ten or more carbon atoms. Such diamines are 1,10-decanediamine, 1,12-dodecadiamine and a C-36 primary diamine, such as VERSAMINE 552 (Cognis Corp., Cincinnati, Ohio).

The maleimide-terminated polyimides may be prepared as described in US 2004-0225059. Specific examples of maleimide-terminated polyimides that are usable in the invention are POLYSET 4000, POLYSET 5000, and POLYSET 9000 available from Designer Molecules, Inc. (San Diego, Calif.).

The maleimide-terminated polyimide resin may be present in the adhesive composition at an amount of at least 20, at least about 30, at least about 40 pbw, or even more. In other embodiments, the adhesive composition may contain at least about 40 pbw and less than about 60 pbw of this polyimide resin.

Thermoplastic resins compatible with the maleimide-terminated polyimide resins which are useful in the disclosed compositions include thermoplastic resins which are hydrophobic and are soluble in toluene. By compatible with maleimide-terminated polyimide resins is meant that the thermoplastic resin and the maleimide-terminated polyimide resin are both soluble together in the same solvent, which may be an aromatic solvent. Examples of useful solvents include toluene and xylenes. Examples of thermoplastic resins which are hydrophobic and soluble in toluene are block copolymers of styrene and butadiene. Additional examples of thermoplastic resins which are hydrophobic and soluble in toluene are block copolymers of styrene and isoprene. Other examples of thermoplastic resins which are hydrophobic and soluble in toluene are block copolymers of styrene and combinations of butadiene and isoprene. Styrene and butadiene block copolymers that are useful in the present invention may be diblock copolymers which contain a segment of styrene polymer and a segment of butadiene polymer covalently bonded together. Styrene and butadiene block copolymers that are useful in the present invention may be triblock copolymers which contain two segments of styrene polymer and one segment of butadiene polymer, wherein each of the segments of styrene polymer are covalently bonded to the segment of butadiene polymer. Additional styrene and butadiene block copolymers that are useful in the present invention may be block copolymers of styrene and butadiene wherein the butadiene segment has been hydrogenated.

Additional thermoplastic resins which are useful in the present invention are triblock copolymers with a segment of styrene polymer, a segment of butadiene polymer and a segment of methacrylate ester polymer. The thermoplastic resins useful in the present invention include a polymer segment which includes a reactive double bond. The reactive double bond in the one polymer segment of the thermoplastic resin may react with the maleimide terminated polyimide resin during the free radically activated curing process.

Representative examples of thermoplastic resins compatible with the maleimide terminated polyimide resins include resins available as "KRATON" resins available from Kraton Polymer LLC, Houston, Tex., such as KRATON FG1901X, KRATON DKX 222CS, KRATON D116K, and KRATON DKX-410CS. Additional representative examples of thermoplastic resins compatible with the maleimide-terminated polyimide resins include styrene-butadiene-methacrylate resins such as SBM AFX233 and SBM AFX123, available from Arkema Inc., Philadelphia, Pa.

The thermoplastic resins may be present in the adhesive composition at an amount that is at least about 30 pbw, at least about 40 pbw, or even more. In some embodiments, the thermoplastic resin may be present in the adhesive composition at an amount greater than 40 pbw and less than 65 pbw.

Liquid rubbers compatible with the maleimide-terminated polyimide resins which are useful in the disclosed compositions include functionalized liquid rubbers. More specifically, functionalized liquid rubbers such as polybutadienes or polyisoprenes functionalized with acrylate, methacrylate, diacrylate, dimethacrylate, or maleic anhydride and copolymers such as polybutadiene-styrene. Currently commercial liquid rubber materials can be used, such as, RICACRYL 3100, a low functionality (mostly di functional) methacrylated polybutadiene, molecular weight (Mn) 6000 and RICACRYL 3500, a high functionality (mostly penta functional) methacrylated polybutadiene molecular weight (Mn) 6000, both from Sartomer Co. Exton, Pa.; CN 303 polybutadiene dimethacrylate and CN 307 polybutadiene diacrylate, both from Sartomer; RICON 131MA10, a low molecular weight polybutadiene functionalized with maleic anhydride (about 10% maleic anhydride) molecular weight about 5000, RICON 184MA6, a low molecular weight polybutadiene-styrene copolymer functionalized with maleic anhydride (about 6% maleic anhydride) having a molecular weight of about 9900, and RICON 156MA17, a low molecular weight polybutadiene functionalized with maleic anhydride (about 17% maleic anhydride) having a molecular weight of about 2500, all from Sartomer. Still other suitable liquid rubbers include LIR 403, a low molecular weight polyisoprene functionalized with maleic anhydride (about 3% maleic anhydride) having a molecular weight of about 25000, UC 105, a low molecular weight methacrylated polyisoprene (about 5 methacrylate functionality) having a molecular weight of about 19000, and UC 203, a low molecular weight methacrylated polyisoprene (about 3 methacrylate functionality) having a molecular weight of about 33000, all from Kuraray Co. Ltd. Tokyo, Japan.

Generally, these liquid rubber materials are included in an amount sufficient to provide room temperature tackiness such that the adhesive remains where placed during alignment and assembly, until cured or mechanically held before curing. The liquid rubber may be present in the adhesive composition at an amount that is below about 30 pbw, below about 20, below about 10, below about 5, or even less. In some embodiments, the liquid rubber may be present in the adhesive composition at an amount greater than 3 pbw and less than 15 pbw.

An ethylenically-unsaturated oligomer, which may be a liquid acrylic oligomer, also can be included in these adhesive compositions. These liquid acrylates can provide tackiness to a layer of an adhesive composition coated onto a substrate such as a release liner. Generally, such materials are included in an amount sufficient to provide room temperature tackiness such that the adhesive remains where placed during alignment and assembly, until cured or mechanically held before curing. This adhesion level in some embodiments is sufficient to label the adhesive composition as pressure sensitive at room temperature. Generally the tack level is low in most embodiments; for example, even below about 1 N/cm. Preferably, such materials are included in an amount up to about 20 pbw. In other embodiments, this amount is at least about 5 pbw, and in some embodiments about 8 to 12 pbw. In other embodiments, the amount is limited to about 20 pbw to prevent incompatibility with the overall composition. Useful materials in this category include, for example, acrylic oligomers, polyester-acrylates, urethane-acrylates, and epoxy-acrylates. Commercial materials include, for example, difunctional bisphenol-A-based epoxy acrylate (CN120 from Sartomer), partially acrylated bisphenol-A epoxy diacrylate (EBECRYL 3605), and bisphenol-A epoxy diacrylates (EBECRYL 37XX Series) (EBECRYL materials are from Cytec Industries).

As used herein, ethylenically unsaturated compounds with acid functionality is meant to include monomers, oligomers, and polymers having ethylenic unsaturation and acid functionality.

Ethylenically unsaturated compounds with acid functionality include, for example, α,β-unsaturated acidic compounds such as glycerol phosphate mono(meth)acrylates, glycerol phosphate di(meth)acrylates, hydroxyethyl(meth) acrylate (e.g., HEMA) phosphates, bis((meth)acryloxyethyl) phosphate, ((meth)acryloxypropyl) phosphate, bis((meth) acryloxypropyl) phosphate, bis((meth)acryloxy)propyloxy phosphate, (meth)acryloxyhexyl phosphate, bis((meth)acryloxyhexyl) phosphate, (meth)acryloxyoctyl phosphate, bis ((meth)acryloxyoctyl) phosphate, (meth)acryloxydecyl phosphate, bis((meth)acryloxydecyl) phosphate, caprolactone methacrylate phosphate, citric acid di- or tri-methacrylates, poly(meth)acrylated oligomaleic acid, poly(meth)acrylated polymaleic acid, poly(meth)acrylated poly(meth) acrylic acid, poly(meth)acrylated polycarboxyl-polyphosphonic acid, poly(meth)acrylated polysulfonate, poly(meth)acrylated polyboric acid, and the like, may be used as components in the adhesive compositions. Monomers, oligomers, and polymers of unsaturated carbonic acids such as (meth)acrylic acids, aromatic (meth)acrylated acids (e.g., methacrylated trimellitic acids) also can be used.

Specific examples of ethylenically unsaturated compound with acid functionality, if present, which are useful in the compositions of the present invention include 6-methacryloyloxyhexyl phosphate and acid funtionalized acrylic resins such as EBECRYL 170 (from Cytec) and PHOTOMER 4173 (from Cognis).

The ethylenically unsaturated compounds with acid functionality, if present, may be used in the adhesive composition at an amount (pbw) that does not undesirably retard the cure time, for example, a level up to about 5 pbw, and in some embodiments at least about 0.01, 0.03, 0.05, 1, or even more.

Coupling agents compatible with, or participating in, a free-radical curing reaction with the other components of this invention also can be used. Examples include a mercapto silane system, acrylic systems, gamma-mercapto propyltrimethoxysilane, gamma-methacryloxypropyl trimethoxy silane, gamma-aminopropyltrimethoxysilane, and vinyltrimethoxysilane. These materials are especially useful for certain embodiments, e.g, those intended for glass substrates, such as ITO-patterned glass for LCD applications.

The coupling agents may be used in the adhesive composition at an amount that is up to about 3 pbw, and in other embodiments, from about 0.01 pbw to 1.0 pbw. For example, good results for coated glass substrates may use around 0.02 pbw.

Examples of useful thermal initiators include but are not limited to those selected from the group consisting of azo compounds such as 2,2-azo-bisisobutyronitrile, dimethyl 2,2'-azobis-isobutyrate, azo-bis-(diphenyl methane), 4-4'-azobis-(4-cyanopentanoic acid); peroxides such as benzoyl peroxide, cumyl peroxide, tert-butyl peroxide, cyclohexanone peroxide, glutaric acid peroxide, lauroyl peroxide, hydrogen peroxide, hydroperoxides such as tert-butyl hydroperoxide and cumene hydroperoxide, peracids such as peracetic acid and perbenzoic acid, potassium persulfate, and peresters such as diisopropyl percarbonate.

Electrically conductive particles may be useful in the adhesive compositions disclosed. Electrically conductive particles such as carbon particles or metal particles of silver, copper, nickel, gold, tin, zinc, platinum, palladium, iron, tungsten, molybdenum, alloys thereof, solder, or the like, or particles prepared with a surface covering or coating of a conductive coating of a metal, alloy, or the like, can be used. It also is possible to use non-conductive particles of a polymer such as polyethylene, polystyrene, phenol resin, epoxy resin, acryl resin or benzoguanamine resin, or glass beads, silica, graphite or a ceramic, with conductive surface coatings (e.g., coating(s) of metal(s), alloy(s), or the like).

Useful electrically conductive particles are available in a variety of shapes (e.g., spherical, ellipsoidal, cylindrical, flakes, needle, whisker, platelet, agglomerate, crystal, acicular). The particle may have a slightly rough or spiked surface. The shape of the electrically conductive particles is not particularly limited but a nearly spherical shape is preferred in some embodiments. The choice of shape is typically dependent upon the rheology of the selected resin components and ease of processing of the final resin/particle mix. Combinations of particle shapes, sizes, and hardness may be used in the disclosed adhesive compositions.

In other embodiments, the adhesive composition of this disclosure also can be used for adhesives conductive through the thickness as well as in the plane, also called isotropic adhesives. Any known means for achieving isotropic conductive adhesives, such as increasing the volume loading of electrically conductive particles, inclusion of conductive scrim, carbon fibers, and/or elongated particles, can be used. Of course, loading the adhesive with particles, fibers, and/or scrim can reduce adhesion to various substrates. The adhesive compositions of various embodiments of this disclosure allow desirable conductivity levels while providing desirable adhesion levels.

The mean particle size of the conductive particles used may vary depending on the electrode width and the spacing between the adjacent electrodes used for connection. For example, if the electrode width is 50 micrometers (μm) and the spacing between adjacent electrodes is 50 μm (that is, the electrode pitch is 100 μm), a mean particle size of about 3 to about 20 μm is appropriate. By using an anisotropically conductive adhesive composition in which are dispersed conductive particles with a mean particle size in this range, it is possible to achieve fully satisfactory conductive characteristics while also adequately preventing short circuiting between adjacent electrodes. In most cases, since the pitch of the electrodes used for connection between the two circuit substrates will be from about 50 to about 1000 μm, the mean particle size of the conductive particles is preferably in the range of about 2 to about 40 micrometers. If they are smaller than about 2 μm, they may be buried in pits in the electrode surface thus losing their function as conductive particles, and if they are larger about 40 μm, they may tend to limit circuit design freedom due to increased likelihood to produce short circuiting between adjacent electrodes.

The amount of the conductive particles added may vary depending on the area of the electrodes used and the mean particle size of the conductive particles. A satisfactory connection can usually be achieved with a few (for example, about 2 to about 10) conductive particles present per electrode. For even lower electrical resistance, the conductive particles may be included in the composition at about 10 to about 300 per electrode.

The amount of conductive particles with respect to the total volume of the dry composition (that is without solvent) minus the conductive particles (all in volume percent or vol. %) is usually at least about 0.1, in other embodiments at least about 0.5, 1, or even at least about 5. In other embodiments, the amount of conductive particles is below about 30, below about 20, below about 10, or even lower (again, all in vol. %). In one presently preferred embodiment, this amount ranges from about 0.5 to about 10 vol. %.

Adjuvants optionally may be added to the compositions such as colorants, antioxidants, flow agents, bodying agents, flatting agents, inert fillers, binders, fungicides, bactericides, surfactants, plasticizers, and other additives known to those skilled in the art. They can be also substantially unreactive, such as fillers both inorganic and organic. These adjuvants, if present, are added in an amount effective for their art known purpose.

Typically, the adhesive composition will be solvent coated onto a release liner and used as a transfer adhesive film such that the adhesive film can be adhered to a substrate and the liner removed. A typical use for the anisotropically conductive adhesives described in certain embodiments herein is to provide a connection between a flexible printed circuit and a substrate having matching connecting electrodes, for example those found in a flat panel display. Similar connections may be made between a flexible printed circuit and a printed circuit board or another flexible printed circuit. Other applications include flipchip attachment of semiconductor chips to various printed circuit substrates and interconnections between two flexible printed circuits or any combinations thereof. Suitable substrates useful to provide articles include, for example, metals (for example, aluminum, copper, cadmium, zinc, nickel, gold, platinum, silver), glass, various polymeric thermoplastic or thermoset films (for example, polyethylene terephthalate, plasticized polyvinyl chloride, polypropylene, polyethylene, polyimide), ceramics, cellulosics, such as cellulose acetate, and epoxides (e.g., circuit boards such as FR-4).

The amount of heat required for polymerization and the amount of the curing agent used will vary depending on the particular polymerizable composition used and the desired application of the polymerized product. Suitable sources of heat to cure the compositions include induction heating coils, hot bar bonders, ovens, hot plates, heat guns, IR sources including lasers, microwave sources, and the like.

In some embodiments, the adhesive composition of the present disclosure is curable in a time/temperature combination selected from a bond time below about 10 seconds using a temperature below about 200° C. or even below about 170 or 150° C., a bond time below about 5 seconds using a temperature below about 200° C., and a bond time below about 10 seconds using a temperature below about 150° C. In other embodiments, the adhesive composition of the present disclosure is curable using a bond time (in seconds) of below about 10, below about 8, below about 5, below about 3, or even faster. In other embodiments, the adhesive composition of the present disclosure is curable using a bond temperature (° C.) of below about 200, below about 150, below about 140, below about 130, below about 120, or even lower.

In some embodiments, the adhesive composition of the present disclosure is stable at room temperature for at least about 1 week, at least about 2 weeks, at least about 3 or 4 weeks, or even longer. Of course, reducing the temperature from room temperature (about 25° C.) can increase the shelf life. In some embodiments, the adhesive compositions of this disclosure provide about four weeks of storage life at room temperature and yet are reactive enough to cure in about 10 seconds in a bonding cycle with a maximum adhesive temperature of about 150° C.

The disclosed adhesive compositions can be used in any known method. For example, one method involves attaching a first article to a second article comprising providing the adhesive composition as described herein on the first article, contacting the second article to the adhesive on the first article to form an assembly wherein the first article and the second article have the adhesive therebetween, and curing the adhesive. Heat and pressure typically are used with the anisotropic embodiments. Electronic devices, such as liquid crystal display components, can be selected for one of these articles while circuitry, such as flexible circuitry, is selected for the other article. Generally, the adhesive compositions disclosed herein are used to provide electrical communication between the articles.

In various embodiments, the disclosed adhesives have sufficient tack to adhere to the target surface at room temperature to allow the backing or liner to be easily removed. For example, a pre-tacking method can be used to attach the adhesive to a circuit to be joined, either by hand or by using automated equipment. In some embodiments, limited heating and/or limited pressure may be desirable. In one embodiment, a three-step procedure can be used, such as tacking the film to one substrate (i.e., pre-tacking), removing the release liner, and then bonding the first substrate to the second substrate.

Microelectronic devices contemplated for use with the adhesive compositions disclosed include, e.g., flex circuits bonded to another flex circuit, glass such as ITO patterned glass, semiconductor die, chip, flexible printed circuitry, circuit board, etc., and other examples include bonding semiconductor die to glass, chip, circuit board, etc.

In some embodiments, the adhesive compositions after curing and aging for 1000 hours at 85° C./85% relative humidity maintain stable adhesion levels (as measured by peel testing) and maintain low electrical resistance.

Advantages of various embodiments of this invention are further illustrated by the following examples, and the particular materials and amounts thereof recited in these examples, as well as other conditions and details, should not be construed as unduly limiting. All materials are commercially available or known to those skilled in the art unless otherwise stated or apparent.

EXAMPLES

In the test methods and examples below, the sample dimensions are approximate. Materials were available from chemical supply houses such as Aldrich, Milwaukee, Wis., Sigma-Aldrich, St. Louis, Mo., or also as noted below. All material percentages below are reported in weight percent.

Test Methods

Peel Adhesion

Strips of adhesive film (2 mm by 25 mm) were cut from larger samples of each adhesive film. Adhesive film samples were used to bond three different types of flex circuits to Indium-Tin Oxide-coated (ITO-coated) glass substrates. The different types of flex were: (1) adhesive-type polyimide flex (available from Flexible Circuit Technologies, Inc., Minneapolis, Minn.) (2) 3M Brand Adhesiveless Flexible Circuits, (3) Sony Chemical HYPERFLEX, which is described as a two-layer adhesiveless structure of polyimide and copper foil. The flex circuit samples were bonded to the ITO-coated glass with a Unitek pulse heat bonder (Miyachi Unitek Corp., Monrovia, Calif.) with a bar temperature of 300° C., a pressure of 3 MPa and a bond time of 10 seconds. The bonded samples were tested for 90 degree peel adhesion using an Instron 1122 Tensile Tester upgraded with MTS Renew software, both from MTS Systems Corp., Eden Prairie, Minn. The tensile tester was fitted with a 22.7 kg load cell, and a 90 degree peel test fixture. The peel rate was 50 mm/minute. The peak peel force value was recorded. One to three replicates were tested for each test composition. The peak peel force values of the replicates were averaged and are reported below in the tables.

Electrical Resistance Test

Adhesive films samples (2 mm by 25 mm) were used to bond 200 μm pitch gold adhesive-less flex circuits and corresponding FR-4 circuit test boards. The samples were bonded using a Unitek pulse heat bonder with a pressure of 3 MPa and a bar temperature and a bonding time set to achieve the same bondline temperature, measured with a thermocouple, as achieved in the preparation of the peel adhesion test samples. The Electrical resistance of the bonded samples was determined using a 4-Point Kelvin Measurement technique using the following components/settings:

Power source/voltmeter: Model 236 Source-Measure Unit, available from Keithley Instruments, Inc., Cleveland, Ohio Switching matrix: Integra Series Switch/Control Module Model 7001, available from Keithley Instruments, Inc.

Probe station: Circuit Check PCB-PET, available from Circuit Check Inc, Maple Grove, Minn.

PC software: LabVIEW (National Instruments, Austin, Tex.)

Test current: 1 milliamp (mA)

Sense compliance (volts): 0.20

The bonded samples were placed in the probe station, and 15 measurements were taken on each sample. The average of these measurements is reported in the tables below.

Materials Used

| Trade Name/ Material | Source | Description |
| --- | --- | --- |
| LUPEROX 98 | Arkema Inc. | Benzoyl peroxide |
| A-174 | Momentive Performance Materials Inc., Wilton, CT | Silquest A-174, gamma-methacryloxypropyltrimethoxysilane |
| POLYSET 5000 | DMI | Maleimide terminated polyimide resin (~5000 MW), 50% solids in toluene |
| KRATON DKX 222CS | Kraton Polymers | Styrene-butadiene-styrene block copolymer, dissolved at 30% solids in toluene |
| EBECRYL 171 | Cytec Surface Specialties Inc., Smyrna, Georgia | Methacrylate functionalized modified phosphoric acid ester |
| SR833s | Sartomer | Tricyclodecane dimethanol diacrylate. |
| VAMAC G | Dupont, Wilmington, DE | Ethylene/methyl acrylate copolymer with low concentration of acid functionality dissolved in toluene at 30% solids |
| RICACRYL 3100 | Sartomer | Low functionality (mostly di functional) methacrylated polybutadiene, molecular weight (Mn) 6000 |
| RICACRYL 3500 | Sartomer | High functionality (mostly penta functional) methacrylated polybutadiene molecular weight (Mn) 6000. |
| CN 303 | Sartomer | Polybutadiene dimethacrylate |
| CN 307 | Sartomer | Polybutadiene diacrylate |
| RICON 131MA10 | Sartomer | Low molecular weight polybutadiene functionalized with Maleic Anhydride. (about 10% maleic anhydride) molecular weight about 5000. |
| RICON 184MA6 | Sartomer | Low molecular weight polybutadiene-styrene copolymer functionalized with Maleic Anhydride.(about 6% maleic anhydride) molecular weight about 9900. |
| RICON 156MA17 | Sartomer | Low molecular weight polybutadiene functionalized with Maleic Anhydride. (about 17% maleic anhydride) molecular weight about 2500. |
| LIR 403 | Kuraray Co. Ltd., Tokyo, Japan | Low molecular weight polyisoprene functionalized with maleic anhydride (about 3% maleic anhydride) molecular weight about 25000. |
| UC 105 | Kuraray | Low molecular weight methacrylated polyisoprene (about 5 methacrylate functionality) molecular weight about 19000. |
| UC 203 | Kuraray | Low molecular weight methacrylated polyisoprene (about 3 methacrylate functionality). Molecular weight about 33000 |
| AEROSIL 200 | Degussa Corp. Piscataway, NJ | Hydrophilic fumed silica with a specific surface area of 200 m$^2$/g |
| Particles I | JCI USA, White Plains, NY | 22 GNR 3.8 - EH: Gold/nickel coated benzoguanine plastic particle, average particle size 3.8 μm |
| Particles II | JCI USA | 7 GNR 8: 7% gold-coated nickel particles, average mean size 8 μm |
| Particles III | JCI USA | 13 GNR10-MX 13% gold nickel coated plastic particles, average mean size 10 um |

Examples 1-10 and Comparative Example 1 (CE-1)

The adhesive solutions were prepared and were used to prepare films as follows. The components listed in the table below were combined in a small jar and mixed with an air driven mixer fitted with a high shear blade for approximately five minutes. The solution was degassed by placing the jar in a vacuum chamber at ambient temperature until bubbling stopped. The degassed solution was spread on a silicone treated polyethylene terephthalate (PET) film using a knife coater. The coated solution was dried for 5 minutes in a forced air oven set at 50° C. The dried adhesive film thickness was about 20 μm.

Films coated from Examples 1 through 10 all had markedly increased tack compared to Comparative Example 1. Table 2 (below) shows peak exotherm temperature measured by DSC and 90 peel adhesion measured after using the ACF Examples to bond flex circuit to ITO-coated glass under the bonding conditions as follows: 150° C. for 10 sec at 3 MPa, 160° C. for 10 sec at 3 MPa, and 170° C. for 10 sec at 3 MPa.

In Table 2, "n/a" means a property was not measured. The results demonstrated simultaneous improvement in room temperature tack, lower curing exotherm temperature, and increased peel adhesion between flex circuit and ITO coated glass, by adding functionalized liquid rubbers to the composition according to the present invention.

TABLE 1

Example Content

| Material | 1 | 2 | 3 | 4 | 5 | 6 | 7 | 8 | 9 | 10 | CE-1 |
|---|---|---|---|---|---|---|---|---|---|---|---|
| POLYSET 5000 | 6.56 | 6.56 | 6.56 | 6.56 | 6.56 | 6.56 | 6.56 | 6.56 | 6.56 | 6.56 | 6.56 |
| SR833s | 1.50 | 1.50 | 1.50 | 1.50 | 1.50 | 1.50 | 1.50 | 1.50 | 1.50 | 1.50 | 1.50 |
| KRATON 222 | 18.30 | 18.30 | 18.30 | 18.30 | 18.30 | 18.30 | 18.30 | 18.30 | 18.30 | 18.30 | 21.60 |
| EBECRYL 171 | 0.10 | 0.10 | 0.10 | 0.10 | 0.10 | 0.10 | 0.10 | 0.10 | 0.10 | 0.10 | 0.10 |
| A-174 | 0.02 | 0.02 | 0.02 | 0.02 | 0.02 | 0.02 | 0.02 | 0.02 | 0.02 | 0.02 | 0.02 |
| Peroxide | 0.10 | 0.10 | 0.10 | 0.10 | 0.10 | 0.10 | 0.10 | 0.10 | 0.10 | 0.10 | 0.10 |
| AEROSIL 200 | 0.23 | 0.23 | 0.23 | 0.23 | 0.23 | 0.23 | 0.23 | 0.23 | 0.23 | 0.23 | 0.23 |
| Particles | 0.50 | 0.50 | 0.50 | 0.50 | 0.50 | 0.50 | 0.50 | 0.50 | 0.50 | 0.50 | 0.50 |
| Liquid Rubber | 1.00 Ricacryl 3100 | 1.00 CN 303 | 1.00 CN 307 | 1.00 Ricacryl 3500 | 1.00 Ricon 131MA10 | 1.00 Ricon 184MA6 | 1.00 Ricon 156MA17 | 1.00 LIR 403 | 1.00 UC 105 | 1.00 UC 203 | 0.00 n/a |

TABLE 2

Peak Exotherm and Peak Peel Force
Peel results are in grams (force) per cm.

| Test | 1 | 2 | 3 | 4 | 5 | 6 | 7 | 8 | 9 | 10 | CE-1 |
|---|---|---|---|---|---|---|---|---|---|---|---|
| Peak exotherm (C.) | 133 | 131 | 136 | 132 | 132 | 130 | 129 | 132 | 135 | 131 | 135 |
| Peel 150 C Bond | 555 | 1539 | 1177 | 728 | 98 | 838 | 962 | 263 | 422 | 528 | 815 |
| Peel 160 C Bond | 670 | 1052 | 690 | n/a | 85 | 407 | 1151 | n/a | n/a | n/a | 657 |
| Peel 170 C Bond | 954 | 1831 | 1607 | 388 | 126 | 1535 | 1850 | 113 | 517 | 565 | 570 |

Examples 11-14 and Comparative Example 2 (CE-2)

The adhesive solutions were prepared and used to prepare films as in Examples 1-10, except using the components listed in Table 3 and then coating onto PET release liner using a knife coater with the gap set to 6 mils (152 μm). Coated films were then dried in a forced air oven at 50° C. for 5 minutes yielding films having a thickness of 40 μm.

TABLE 3

Example Content

| Material | 11 | 12 | 13 | 14 | CE-2 |
|---|---|---|---|---|---|
| POLYSET 5000 | 6.56 | 6.56 | 6.56 | 8.00 | 6.56 |
| SR833s | 1.50 | 1.50 | 1.50 | 1.50 | 1.50 |
| KRATON 222 | 13.80 | 10.47 | 13.47 | 11.67 | 21.60 |
| VAMAC G | 7.80 | 7.80 | 4.80 | 4.80 | 0.00 |
| EBECRYL 171 | 0.10 | 0.10 | 0.10 | 0.10 | 0.10 |
| A-174 | 0.02 | 0.02 | 0.02 | 0.02 | 0.02 |
| Benzoyl Peroxide | 0.10 | 0.10 | 0.10 | 0.10 | 0.10 |
| AEROSIL 200 | 0.23 | 0.23 | 0.23 | 0.23 | 0.23 |
| Particles II | 1.90 | 1.90 | 1.90 | 1.90 | 1.90 |
| CN 303 | 0.00 | 1.00 | 1.00 | 1.00 | 0.00 |

Films coated from Examples 11-14 all had markedly increased tack compared to CE-2, with the highest levels of tack in films from 12, 13, and 14 containing the liquid rubber, CN 303 (Sartomer). Table 4 compares peak exotherm temperature measured by DSC and 90 peel adhesion measured after using the ACF Examples to bond flex circuit to PC board under the following bonding conditions: 140° C. for 5 sec at 3 MPa, 160° C. for 5 sec at 3 MPa, and 170° C. for 7 sec at 3 MPa.

TABLE 4

Peak Exotherm and Peak Peel Force
Peel results are in grams (force) per cm.

| Test | 11 | 12 | 13 | 14 | CE-1 |
|---|---|---|---|---|---|
| Peak exotherm (° C.) | 119 | 119 | 124 | 125 | 135 |
| Peel 140° C. Bond | 1229 | 1248 | 1221 | 1278 | 630 |
| Peel 160° C. Bond | 1115 | 1329 | 1447 | 1382 | 629 |
| Peel 170° C. Bond | 943 | 1215 | 1389 | 1255 | 735 |

As in Examples 1-10, the results of Examples 11-14 show that the addition of liquid rubber according to the present invention increases both tack and peel adhesion and also decreases the peak exotherm temperature, which allows bonding at lower temperatures and shorter time.

Examples 15-18 and Comparative Example 3 (CE-3)

The adhesive solutions were prepared and used to prepare films as in Examples 1-10, except using the components listed in Table 5 and then coating onto PET release liner using a knife coater. Coated films were then dried in a forced air oven at 50° C. for 5 minutes yielding films having a thickness of 20 μm.

First, tape (410B from 3M Company) was applied with hand pressure to the platen of an IMASS 2000 (Instrumentors Inc., Strongsville, Ohio) and the paper liner was removed from the tape, exposing the second adhesive side of the tape. The coated formulation, with the exemplary anisotropic conductive film (ACF) coating face down was applied to the 410B tape and rubbed down by hand. The liner was pulled back exposing the ACF attached to the 410B tape to generate a leader that was clamped by the instrument pull bar. The peel test was started and the force to remove the liner from the one inch (25.4 cm) wide ACF Example material (which remained on the 410B surface) was recorded.

The IMASS 2000 pull tester was affixed with a 2 kg (5 lb.) load cell. The dwell time was set at 4 sec, average peel time was 10 seconds, the peeling speed was 12 inches (30.5 cm) per minute, peel force was reported in grams. Here, the liner peel was a smooth fluid removal of the liner and the average force for removal was measured. The dwell time allowed the peel sample to establish equilibrium. Three pulls from the same example material were recorded and reported in the table below. The higher tack formulations exhibited higher liner release.

TABLE 5

Example Content

| Material | Example | | | | |
| --- | --- | --- | --- | --- | --- |
| | 15 | 16 | 17 | 18 | CE-3 |
| POLYSET 5000 | 6.56 | 6.56 | 6.56 | 8.00 | 6.56 |
| SR833s | 1.50 | 1.50 | 1.50 | 1.50 | 1.50 |
| KRATON 222 | 13.80 | 10.47 | 13.47 | 11.67 | 21.60 |
| VAMAC G | 7.80 | 7.80 | 4.80 | 4.80 | 0.00 |
| EBECRYL 171 | 0.10 | 0.10 | 0.10 | 0.10 | 0.10 |
| A-174 | 0.02 | 0.02 | 0.02 | 0.02 | 0.02 |
| Benzoyl Peroxide | 0.10 | 0.10 | 0.10 | 0.10 | 0.10 |
| AEROSIL 200 | 0.23 | 0.23 | 0.23 | 0.23 | 0.23 |
| Particles I | 0.50 | 0.50 | 0.50 | 0.50 | 0.50 |
| CN 303 | 0.00 | 1.00 | 1.00 | 1.00 | 0.00 |

TABLE 6

Test Results

| Example | Average Peel (g) |
| --- | --- |
| 15 | 5.9 |
| 15 | 5.8 |
| 15 | 5.2 |
| 16 | 8.9 |
| 16 | 9.4 |
| 16 | 10.2 |
| 17 | 6.8 |
| 17 | 7.0 |
| 17 | 5.8 |
| 18 | 5.1 |
| 18 | 3.9 |
| 18 | 4.7 |
| CE-3 | 0.8 |
| CE-3 | 1.0 |
| CE-3 | 0.9 |

The adhesive solutions were prepared and used to prepare films as in Examples 1-10, except using the components listed in Table 7 and then coating onto PET release liner using a knife coater. Coated films were then dried in a forced air oven at 50° C. for 5 minutes yielding films having a thickness of 25 μm.

Peel Adhesion ITO/PET

Strips of adhesive film (2 mm by 25 mm) were cut from larger samples of each adhesive film. Adhesive film samples were used to bond flex circuits to Indium-Tin Oxide-coated (ITO-coated) polyester substrates. The type of flex was: adhesive-type polyimide flex (available from Flexible Circuit Technologies, Inc., Minneapolis, Minn.). The flex circuit samples were bonded to the ITO-coated polyester with a Unitek pulse heat bonder (Miyachi Unitek Corp., Monrovia, Calif.) with a bar temperature of 227° C., a pressure of 1 MPa and a bond time of 10 seconds (for tests at 140° C. cure in Table 8 below) or a bar temperature of 280° C., a pressure of 1 MPa, and bond time of 10 seconds (for tests at 170° C. cure in Table 8 below). The bonded samples were tested for 90 degree peel adhesion using an MTS Insight 5 kN Extended Length frame tensile tester (MTS Systems Corp., Eden Prairie, Minn.). The tensile tester was fitted with a 500N load cell, and a 90 degree peel test fixture. The peel rate was 50 mm/minute. The peak peel force value was recorded. Three to twelve replicates were tested for each test composition. The peak peel force values of the replicates were averaged and are reported below in Table 8.

TABLE 7

Example Content

| Material | Example | | | | |
| --- | --- | --- | --- | --- | --- |
| | 19 | 20 | 21 | 22 | 23 |
| POLYSET 5000 | 6.56 | 6.56 | 6.56 | 6.56 | 6.56 |
| SR833s | 1.50 | 1.50 | 1.50 | 1.50 | 1.50 |
| KRATON 222 | 17.6 | 17.6 | 17.6 | 17.6 | 17.6 |
| VAMAC G | 2.02 | 2.02 | 2.02 | 2.02 | 2.02 |
| EBECRYL 171 | 0.10 | 0.10 | 0.10 | 0.10 | 0.10 |
| A-174 | 0.02 | 0.02 | 0.02 | 0.02 | 0.02 |
| Benzoyl Peroxide | 0.10 | 0.12 | 0.14 | 0.15 | 0.2 |
| AEROSIL 200 | 0.23 | 0.23 | 0.23 | 0.23 | 0.23 |
| Particles III | 0.40 | 0.40 | 0.40 | 0.40 | 0.40 |
| CN 303 | 0.6 | 0.6 | 0.6 | 0.6 | 0.6 |

TABLE 8

Peak Exotherm and Peak Peel Force
Peel results are in grams (force) per cm.

| Test | Example | | | | |
| --- | --- | --- | --- | --- | --- |
| | 19 | 20 | 21 | 22 | 23 |
| Peak exotherm (° C.) | 126 | 125 | 122 | 121 | 120 |
| Peel 140° C. Bond | 624 | 713 | 705 | 852 | 715 |
| Peel 170° C. Bond | 922 | | 1100 | 1092 | 986 |

Foreseeable modifications and alterations of this invention will be apparent to those skilled in the art without departing from the scope and spirit of this invention. This invention should not be restricted to the embodiments that are set forth in this application for illustrative purposes.

What is claimed is:

1. An adhesive composition comprising a mixture of:
   a maleimide terminated polyimide resin;
   a thermoplastic resin compatible with the maleimide terminated polyimide resin;
   a functionalized liquid rubber selected from polybutadienes, polyisoprenes, and copolymers of polybutadiene-styrene wherein the liquid rubber is functionalized with acrylate, methacrylate, diacrylate, dimethacrylate, maleic anhydride, or combinations thereof;
   a thermally activated free radical curing agent; and optionally one or more of
   a silane coupling agent;

an ethylenically unsaturated compound with an acid functionality; and electrically conductive particles and/or scrim.

2. The adhesive composition of claim 1 wherein the maleimide terminated polyimide resin comprises a reaction product of a primary aliphatic diamine with a tetracarboxylic dianhydride followed by reaction with maleic anhydride.

3. The adhesive composition of claim 1 wherein the maleimide terminated polyimide resin comprises a reaction product of a C-36 aliphatic diamine with a tetracarboxylic dianhydride.

4. The adhesive composition of claim 1 further comprising an ethylenically-unsaturated oligomer, which may be an acrylic oligomer.

5. The adhesive composition of claim 1 wherein the thermally activated curing agent is benzoyl peroxide or lauroyl peroxide.

6. The adhesive composition of claim 1 wherein the adhesive, after curing, provides a peel force of at least 1,000 g/cm after bonding to ITO coated glass at a temperature of at least 140° C. and/or a release liner peel level of above 1 gram per inch of sample width after bonding to the liner at room temperature.

7. The adhesive composition of claim 1 wherein the adhesive exhibits a peak exotherm temperature below 140° C.

8. An adhesive film comprising the adhesive composition of claim 1.

9. The adhesive composition of claim 1 wherein the electrically conductive particles are selected from metal particles and metal coated polymeric particles.

10. A curable adhesive film comprising the adhesive of claim 1, optionally wherein the adhesive film has a thickness of from about 5 to about 100 micrometers.

11. A tape comprising the curable adhesive film of claim 10 on a liner.

12. An electronic article comprising a flexible printed circuit and the adhesive composition according to claim 1 adhered to the flexible printed circuit.

13. A liquid-crystal display panel comprising an ITO-patterned glass adhered to the adhesive of claim 1.

14. The adhesive composition of claim 1 having a shelf life of at least about 4 weeks at room temperature.

15. The adhesive composition of claim 1 wherein the adhesive is curable at a temperature selected from below 175° C., below 150° C., and below 140° C.

16. The adhesive composition of claim 1 wherein the adhesive is curable at a temperature below 150° C. coupled with a bond time selected from below 10 seconds, below 8 seconds, and below 5 seconds.

* * * * *